(12) United States Patent
Friedman et al.

(10) Patent No.: US 10,297,315 B2
(45) Date of Patent: May 21, 2019

(54) RESISTIVE MEMORY ACCELERATOR

(71) Applicants: Eby Friedman, Rochester, NY (US);
Isaac Richter, East Amherst, NY (US);
Xiaochen Guo, Bethlehem, PA (US);
Mohammad Kazemi, Rochester, NY (US); Kamil Pas, Ridgewood, NY (US); Ravi Patel, Victor, NY (US);
Engin Ipek, Pittsford, NY (US); Ji Liu, Rochester, NY (US)

(72) Inventors: Eby Friedman, Rochester, NY (US);
Isaac Richter, East Amherst, NY (US);
Xiaochen Guo, Bethlehem, PA (US);
Mohammad Kazemi, Rochester, NY (US); Kamil Pas, Ridgewood, NY (US); Ravi Patel, Victor, NY (US);
Engin Ipek, Pittsford, NY (US); Ji Liu, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 15/657,288

(22) Filed: Jul. 24, 2017

(65) Prior Publication Data
US 2017/0330617 A1    Nov. 16, 2017

Related U.S. Application Data

(63) Continuation of application No. 15/229,818, filed on Aug. 5, 2016, now Pat. No. 9,847,125.

(Continued)

(51) Int. Cl.
*G11C 13/00* (2006.01)
*G11C 7/16* (2006.01)

(52) U.S. Cl.
CPC ........... *G11C 13/004* (2013.01); *G11C 7/16* (2013.01); *G11C 13/0002* (2013.01); *G11C 13/0069* (2013.01)

(58) Field of Classification Search
CPC ........... G11C 13/0002; G11C 13/0004; G11C 13/0021; G11C 13/004; G11C 13/0069;
(Continued)

(56) References Cited

U.S. PATENT DOCUMENTS 9,847,125 B2 * 12/2017 Friedman ............. G11C 13/004
2003/0081445 A1 * 5/2003 Van Brocklin et al. ................. G11C 17/00
354/100

(Continued)

OTHER PUBLICATIONS

International Technology Roadmap for Semiconductors 2013 Edition. http://www.itrs.netLinks/2013ITRSHome2013.htm.
(Continued)

*Primary Examiner* — Tan T. Nguyen
(74) *Attorney, Agent, or Firm* — Timothy W. Menasco, Esq.; Harter Secrest & Emery LLP

(57) ABSTRACT

Presented is a method and apparatus for solving. The method includes receiving, by a resistive memory array, a first data, the resistive memory array comprising a plurality of cells, wherein the receiving comprises setting a plurality of resistances on the plurality of cells, wherein each of the plurality of resistances are based on the first data. The method further includes receiving, by the resistive memory array, a second data, wherein the receiving comprises applying at least one of a current and a voltage based on the second data on the plurality of cells. The method still further includes determining, by the resistive memory array, an initial unknown value, the initial value based on the first data and the second data.

11 Claims, 6 Drawing Sheets

Related U.S. Application Data

Figures 1, 2A:
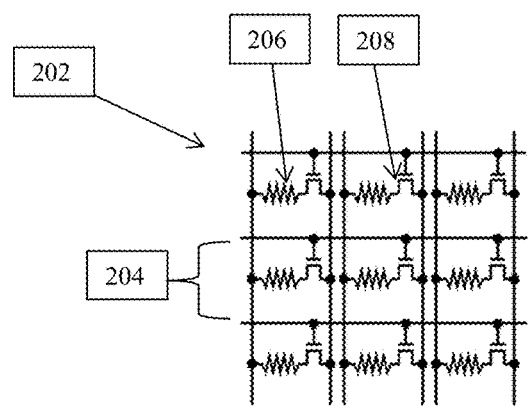

(60) Provisional application No. 62/202,585, filed on Aug. 7, 2015, provisional application No. 62/201,312, filed on Aug. 5, 2015.

(58) Field of Classification Search
CPC .... G11C 13/0007; G11C 13/0097; G11C 7/16
USPC .............. 365/148, 158, 163, 189.15, 189.16
See application file for complete search history.

(56) References Cited

U.S. PATENT DOCUMENTS

2011/0316588 A1* 12/2011 Lorenz ................... H03M 11/24
327/77
2012/0230081 A1* 9/2012 Close et al. ............ G11C 11/00
365/148

OTHER PUBLICATIONS

Valov et al., "Electrochemical metallization memories—fundamentals, applications, prospects." 22(25)254003, 2011.
Hong et al. Metal-oxide RRAM. Proceedings of the IEEE, 100(6):1951-1970, Jun. 2012.
Fackenthal et al., 16Gb ReRAM with 200MB/s write and 1GB/s read in 27nm technology. In Solid-State circuits Conference Digest of Technical Papers (ISSCC), 2014 IEEE International, pp. 338-339, Feb 2014.
Liu et al., A 130.7mm2 2-layer 32Gb ReRAM memory device in 24nm technology. In Solid-State circuits Conference Digest of Technical Papers (ISSCC), 2013 IEEE International, pp. 210-211, Feb. 2013.
Tehrani et al., Magnetoresistive Random Access Memory Using Magnetic Tunnel Junctions. 91(5):703-714, 2003.
Ralph et al., Spin Transfer Torques. 320(7):1190-1216, 2007.
Saad, Iterative Methods for Sparse Linear Systems: Second Edition. Society for Industrial and Applied Mathematics (SIAM, 3600 Market Street, Floor 6, Philadelphia, PA 19104), 2003.
Shewchuk, an Introduction to the Conjugate Gradient Method Without the Agonizing Pain, Aug. 1994.
Cowan, A VLSI Analog Computer/Math Co-Processor for a Digital Computer. Columbia University, 2005.
Cowan et al., A VSLI Analog Computer/Digital Computer Accelerator. IEEE Journal of Solid-State Circuits, vol. 41, No. 1: pp. 42-53, Jan. 2006.
Davis et al., The University of Florida Sparse Matrix Collection. ACM Transactions on Mathematical Software (TOMS), 38(1):1, 2011.
Niu et al., Design Trade-Offs for High Density Cross-Point Resistive Memory. In Proceedings of the 2012 ACM/IEEE International Symposium on Low Power Electronics and Design, ISLPED '12, pp. 209-214, New York, NY, USA, 2012. ACM.

* cited by examiner

|  | Switching Latency (ns) | Cell Size (F²) | Switching Energy (pJ/bit) | $R_{HI}/R_{LO}$ Ratio | Endurance |
|---|---|---|---|---|---|
| Phase Change Memory | 40 to 400 | 4 to 16 | 1 to 6 | 10 to 100 | $10^6$-$10^9$ |
| Resistive Random Access Memory | 5 to 10 | 4 to 8 | 0.1 to 3 | 20 to 5000 | $10^6$-$10^9$ |
| Spin-Transfer Torque Magnetoresistive Random-Access Memory | 4 to 20 | 6 to 20 | 0.15 to 2.5 | 1.5 to 2.5 | $10^{15}$-$10^{16}$ |

802: (a) receiving, by a resistive memory array, a first data, the resistive memory array comprising a plurality of cells, wherein the receiving comprises setting a plurality of resistances on the plurality of cells, wherein each of the plurality of resistances are based on the first data; (b) receiving, by the resistive memory array, a second data, wherein the receiving comprises applying at least one of a current and a voltage based on the second data on the plurality of cells; and (c) determining, by the resistive memory array, an initial unknown value, the initial value based on the first data and the second data.

804: wherein the first data comprises a coefficient matrix of a system of linear equations

806: wherein the second data is based on a known b-vector or a known x-vector of the system of linear equations

808: wherein the initial unknown value comprises an approximate solution to the system of linear equations

810: further comprising setting a plurality of resistances on the plurality of cells, wherein each of the plurality of resistances are based on the determined initial unknown value, applying at least one of a current and a voltage on the plurality of cells based on the second data, and determining second initial unknown value based on the determined initial unknown value and the second data

812: wherein the determined second initial unknown value is a closer approximate solution to the system of linear equations than the initial unknown value

FIG. 8

US 10,297,315 B2

RESISTIVE MEMORY ACCELERATOR

STATEMENT REGARDING FEDERALLY SPONSORED RESEARCH OR DEVELOPMENT

This invention was made with Government support under Contract #CCF1054179 and CCF1217418 awarded by the National Science Foundation. The Government has certain rights in the invention.

BACKGROUND

Computer memory, or often memory, refers to the devices used to store information for use in a computer or other electronic device. Memory is used for storage systems, which function at high-speed, which is different from secondary memory, which provides program, and data storage that is slow to access but offers higher storage capacity.

In mathematics, linear equations or a system of linear equations is a collection of linear equations involving the same set of variables. The theory of linear systems is the basis and a fundamental part of linear algebra, a subject which is used in most parts of modern mathematics. Computational algorithms for finding the solutions are an important part of numerical linear algebra, and play a prominent role in engineering, physics, chemistry, computer science, and economics.

SUMMARY

A first aspect of the present disclosure provides a method for solving. The method includes receiving, by a resistive memory array, a first data, the resistive memory array comprising a plurality of cells, wherein the receiving comprises setting a plurality of resistances on the plurality of cells, wherein each of the plurality of resistances are based on the first data. The method further includes receiving, by the resistive memory array, a second data, wherein the receiving comprises applying at least one of a current and a voltage based on the second data on the plurality of cells. The method further includes determining, by the resistive memory array, an initial unknown value, the initial value based on the first data and the second data.

A second aspect of the present disclosure provides an apparatus for solving. The apparatus includes at least one processor, at least one memory operably connected to the at least one processor, and at least one resistive memory array, the resistive memory array comprising a plurality of crosspoint cells, the at least one resistive memory array programmable with at least a first data and a second data, wherein the programmable at least one resistive memory comprises setting a plurality of resistances on the plurality of crosspoint cells based on the first data and applying at least one of a current and a voltage based on the second data. The apparatus further includes at least one sensor, the at least one sensor being operatively coupled to the at least one resistive memory array able to sense at least one of a voltage and a current on the plurality of crosspoint cells.

A third aspect of the present disclosure provides an apparatus for solving. The apparatus includes at least one processor, at least one memory operably connected to the at least one processor, and at least one resistive memory array, the resistive memory array comprising a plurality of crosspoint cells, wherein the at least one processor, the at least one memory including computer program instructions, and the at least one resistive memory array are configured to cause the apparatus to at least set a first data on the at least one resistive memory array, wherein the setting comprises setting a plurality of resistances on the plurality of crosspoint cells, wherein each of the plurality of resistances are based on the first data. The apparatus is further configured to set a second data on the at least one resistive memory array, wherein the setting comprises applying at least one of a current and a voltage on the plurality of crosspoint cells. The apparatus is still further configured to determine an initial unknown value, the initial value based on the first data and the second data.

The following will describe aspects of the present disclosure, but it should be appreciated that the present disclosure is not limited to the described aspects and various modifications are possible without departing from the basic principles.

BRIEF DESCRIPTION OF THE SEVERAL VIEWS OF THE DRAWING(S)

FIG. 1 presents a comparison of resistive memory technologies.

FIG. 2a presents a resistive memory array organization suitable for use in practicing aspects of this disclosure.

Figure 2B:
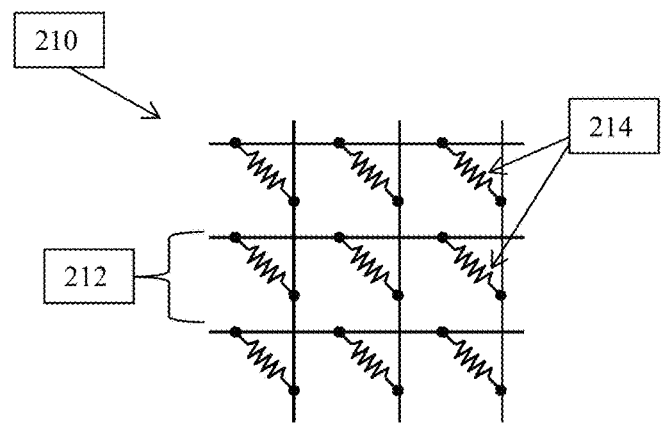

FIG. 2b presents an alternative resistive memory array organization suitable for use in practicing aspects of this disclosure.

Figure 3:
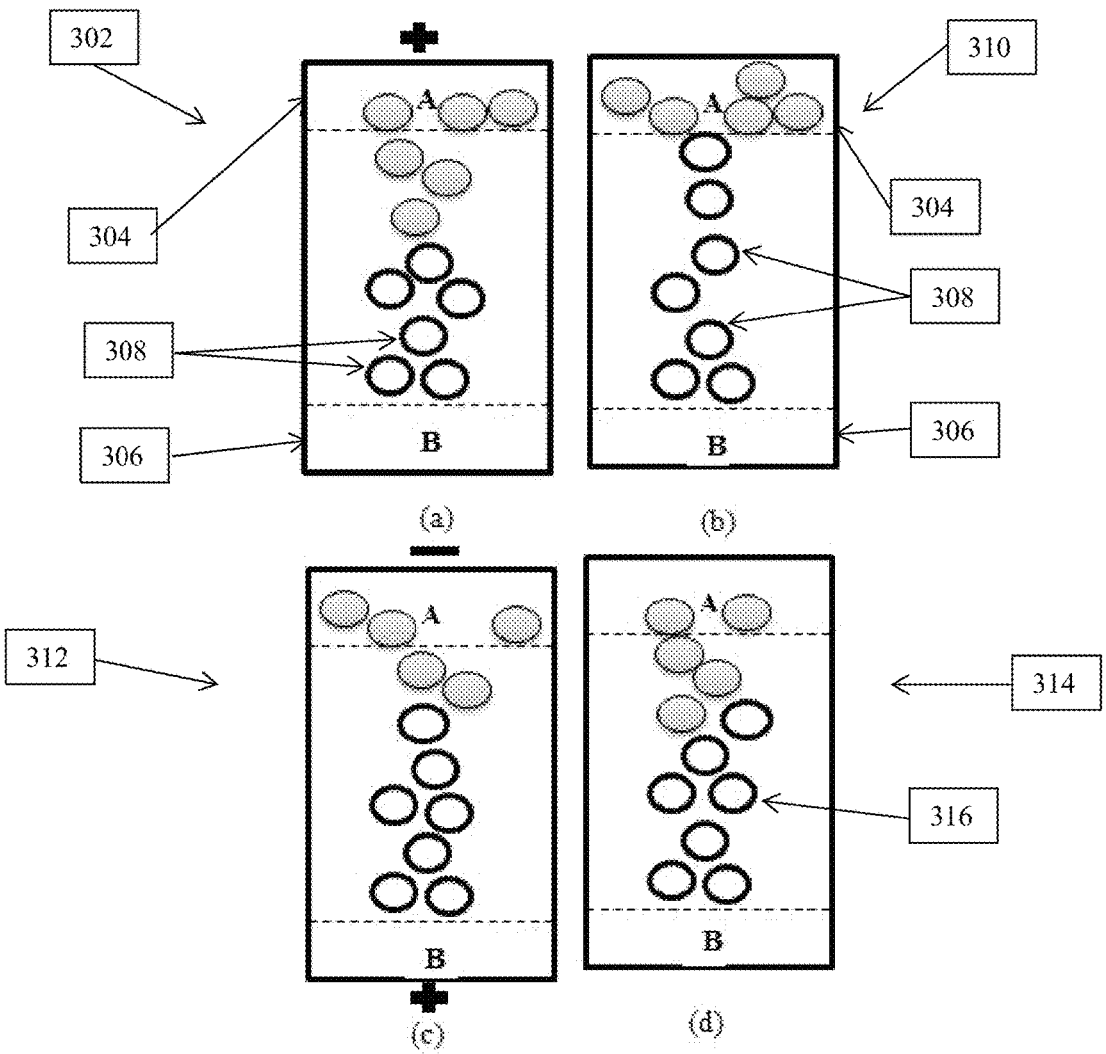

FIG. 3 presents resistance switching in a metal-oxide memristor.

Figure 4:
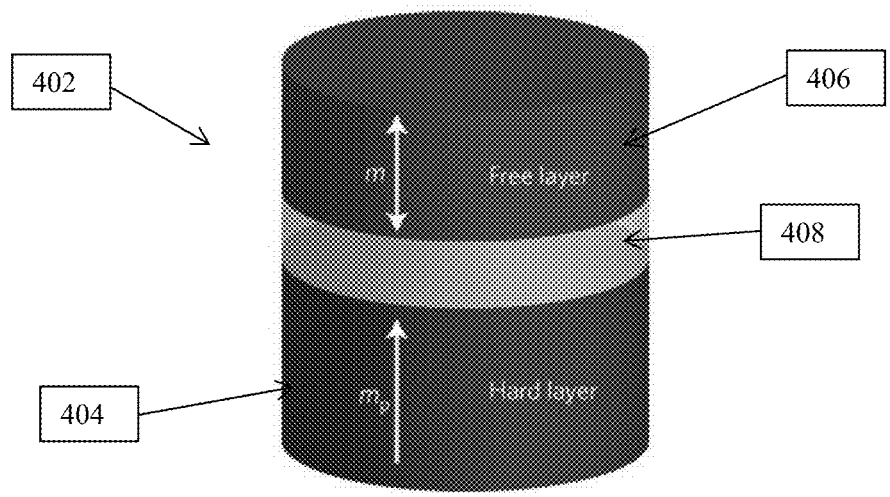

FIG. 4 presents a magnetic tunnel junction structure.

Figure 5:
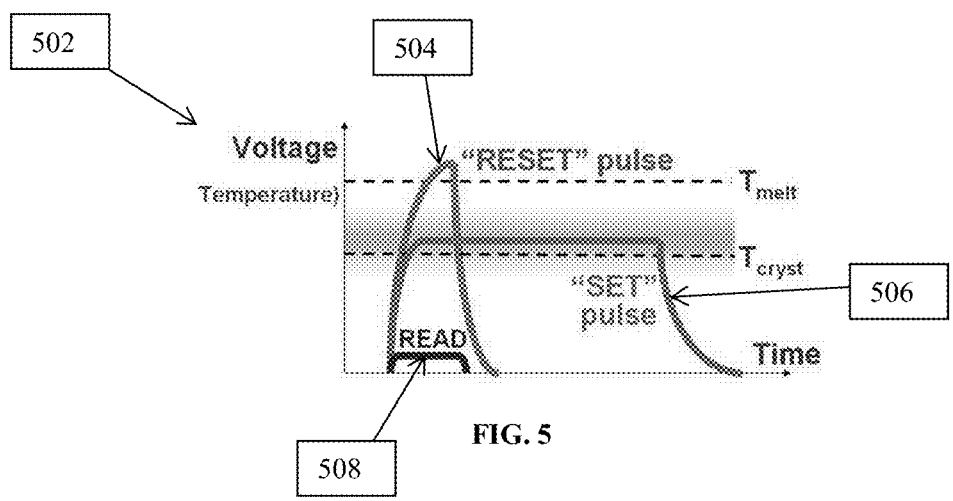

FIG. 5 presents a graph of voltage versus time for phase change memory.

Figure 6:
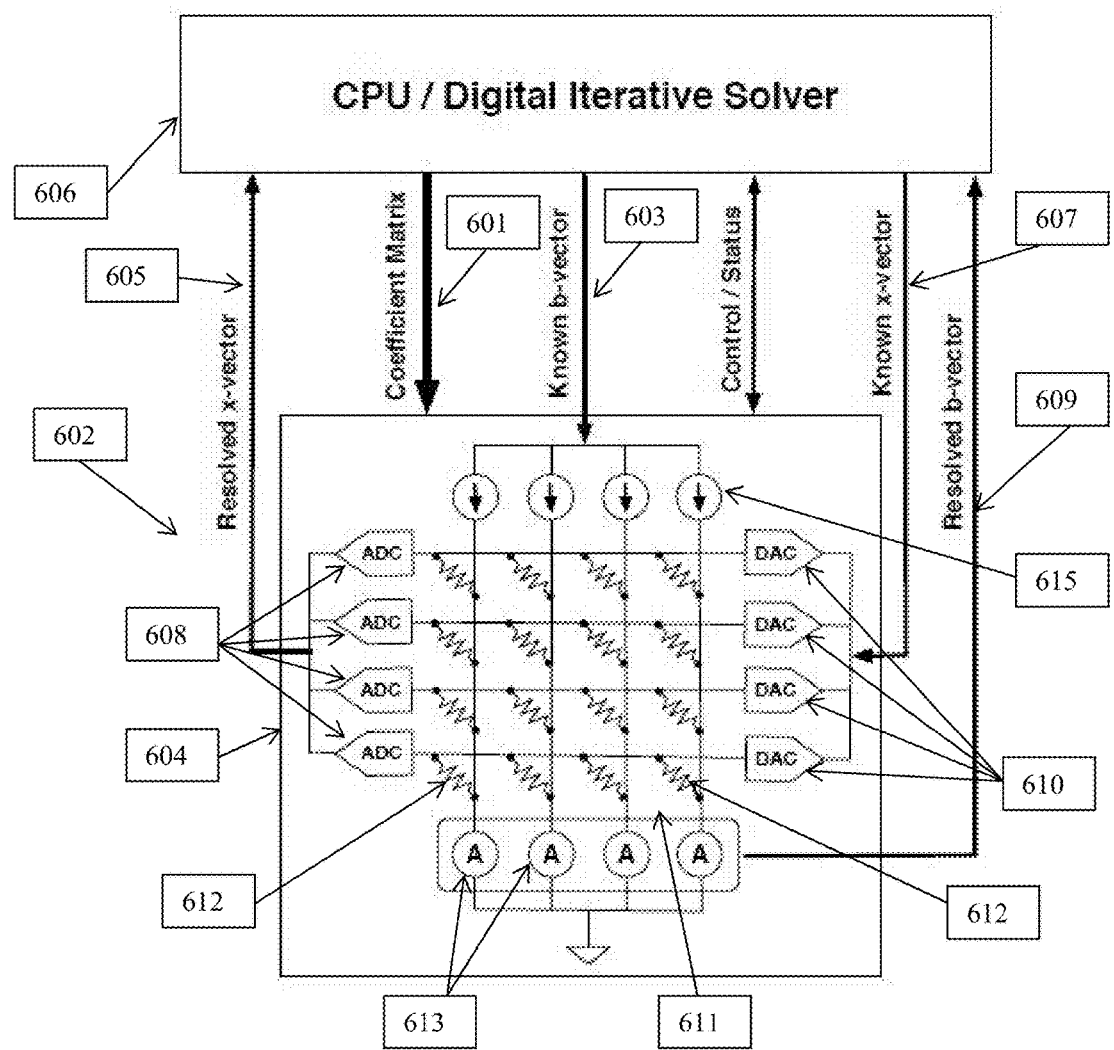

FIG. 6 presents a cross-point array suitable for practicing aspects of this disclosure.

Figure 7:
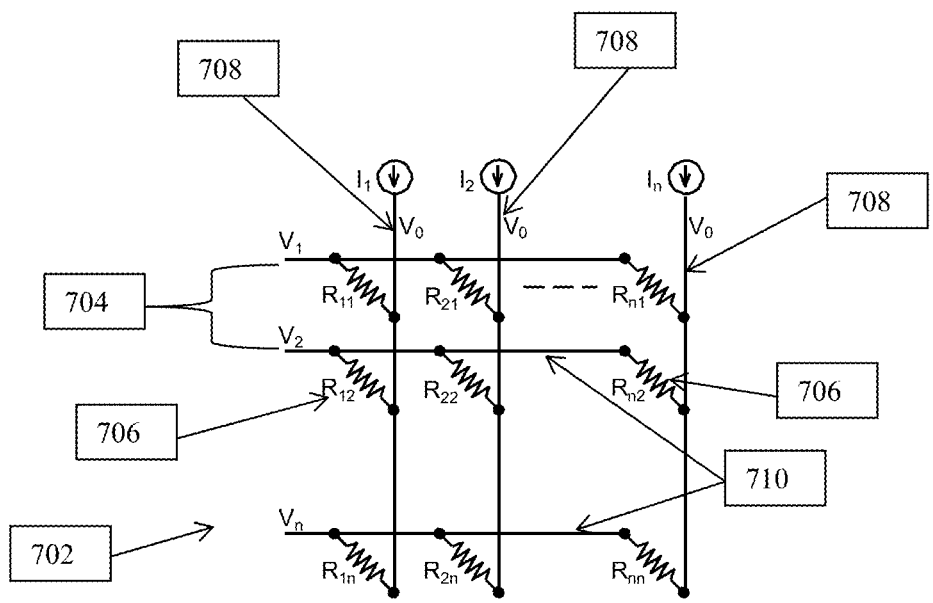

FIG. 7 presents a linear system solver based on resistive cross-point array suitable for practicing aspects of this disclosure.

FIG. 8 presents a logic flow diagram in accordance with a method and apparatus for performing aspects of this disclosure.

DETAILED DESCRIPTION

Resistive memories have potential as static random-access memory (SRAM) and dynamic random-access memory (DRAM) replacements because resistive memories represent information using resistance rather than electrical charge, and thus hold the potential to scale to much smaller geometries than charge based memories. Since resistive memory retains state without charge, resistive memories do not need to be refreshed periodically like DRAM or connected to a constant supply voltage like SRAM. Resistive memories also dissipate near-zero leakage power at standby. RRAM, spin-torque transfer magneto resistive RAM (STT-MRAM), and phase change memory (PCM) all rely on resistance to represent data, but the physical mechanisms of switching resistances are different.

FIG. 1 presents a comparison between cell size, resistance ratio, switching latency, switching energy, and endurance of RRAM, STT-MRAM, and PCM. As is evident, from FIG. 1, each has long switching latency and high switching energy within the cells compared to SRAM and DRAM. RRAM and PCM typically have a limited write endurance. This prevents RRAM and PCM from being used in frequently written structures, such as L1 data cache. However, the high $R_{High}/R_{Low}$ ratio as shown in FIG. 1, enables RRAM and PCM to act as a multi-level cell (MLC). In other words, RRAM and PCM are able to store multiple bits in one storage cell, which increases their data density. Another way to improve data density is by eliminating access transistors.

Referring to FIG. 2a, shown is an organization of an array 202 that includes nine (9) one-transistor one-resistor (1T1R) cells 204. As depicted, each 1T1R 204 includes a single resistor 206 and a single transistor 208. A resistor 206 includes any passive two-terminal electrical component that implements electrical resistance as a circuit element. Resistors 206 are able to limit current flow. Resistor 206 includes any type of resistor known in the art that is able to limit current flow operable in an electronic circuit.

Transistor 208 includes semiconductor devices that can amplify and switch electronic signals and electrical power. Transistor 208 can be composed of semiconductor material and able to connect to an external circuit, such as resistor 206. Transistor 208 can be configured to have a voltage or current applied to transistor 208 and the ability to change the current. Transistor 208 includes any type of transistor known in the art that is able to operate in an electronic circuit.

In practice, when a particular 1T1R cell 204 is accessed each of the corresponding wordlines and read/write through bitlines are also activated. A wordline refers to the rows of array 202 shown for example in FIG. 2a. A bitline refers to the columns of array 202 shown for example in FIG. 2a. In other words, when a particular 1T1R cell 204 is accessed or activated, the 1T1R cells 204 located in the same row and column are also activated or accessed. However, in some aspects, when a particular 1T1R cell 204 is accessed or activated, the 1T1R cells 204 located in the same row are activated or accessed and the 1T1R cells 204 in the same column are not activated or accessed. Conversely, in another aspect, when a particular 1T1R cell 204 is accessed or activated, the 1T1R cells 204 located in the same row are not activated or accessed and the 1T1R cells 204 in the same column are activated or accessed.

FIG. 2b illustrates an alternative array organization. Shown in FIG. 2b is cross-point array 210, which includes nine (9) resistive memory cells 212 with resistors 214. As illustrated in FIG. 2b, each resistive memory cell 212 contains only a single resistor 214. Each resistive memory cell 212 is connected directly to the cross-point array's 210 wordlines and bitlines without an access transistor as is the case in FIG. 2a. In other words, each resistive memory cell 212 is connected to the other resistive memory cells 212 in cross-point array 210 without the use of a transistor. Though cross-point array 210 has a higher density than array 202, cross-point array 210 may suffer from sneak current due to the lack of isolations of the resistive memory cells 212. However, issues with sneak current can be alleviated by using resistive memories with high $R_{High}/R_{Low}$ ratio or stacking memory cells with a diode.

In one aspect, Memristor includes a metal-oxide insulator between two metals forming an MIM stack. Memristors have the ability to alter or change resistances by building filaments within their metal-oxide insulator, which create conductive paths in the MIM stack between the two metals. Two types of memristors include conductive-bridging RAM (CBRAM), and the metal-oxide memristor (MeOx-RRAM).

A CBRAM cell operates through the diffusion of an electrochemically active metal electrode such as silver (Ag) or copper (Cu) ions. The electrochemically active ions can create conductive bridges in the MIM stack between the two metals when a voltage is applied to the MIM stack. Conversely, a MeOx-RRAM cell operates by building conductive filaments based on oxygen vacancies by evacuating oxygen ions from the insulator between the two metal electrodes.

Referring to FIG. 3, depicted is one aspect of a resistance changing process of a metal-oxide memristor. When a set voltage is applied across the electrode 304 and electrode 306 shown in diagram 302, the negatively charged oxygen ions 308 are "knocked-out" from the lattice of electrode 306 and move towards the positively charged anode (electrode 304). The plus sign above electrode 304 and the negative sign below electrode 306 indicates the polarity of an applied voltage. Electrode 304 as depicted in FIG. 3 is tellurium shown as side A and electrode 306 is beryllium shown as side B. However, it should be appreciated that electrode 304 and electrode 306 can be any material that allow for negatively charged ions to move in accordance with the aspects described herein when a voltage is applied to a system similar to that shown in FIG. 3.

As shown in diagram 310, not all of the oxygen ions 308 move into electrode 304, but some of the oxygen ions 308 remain between electrode 304 and electrode 306. The remaining oxygen ions 308 form conductive filaments between electrodes 304 and 306, which results in a low resistance state. To increase cell resistance, cell resistance, a reset voltage can be applied to the electrodes 304 and 306 to move oxygen ions 308 back to the insulator electrode 306. This in turn will disconnect the conductive filament of oxygen ions 308 from electrode 304. The polarity of the reset voltage is opposite to the set voltage for a bipolar memristor, as shown in diagram 312. The negative sign above electrode 304 and the plus sign below electrode 306 in diagram 312 indicate the polarity of the reset voltage. However, for a unipolar memristor the reset voltage will be of the same polarity as the set voltage. Diagram 314 depicts a cell at a high resistance state, in which the oxygen vacancies do not form a path to connect electrode 304 and electrode 306. The height and width of the conductive filaments 316 affect and determine the cell resistance, which enables memristors to represent values over a continuous range.

Magnetoresistive memory operates by relying on a large resistance contrast provided with magnetic tunnel junctions (MTJs). An exemplary MTJ 402 is shown in FIG. 4, which is composed of two ferromagnetic (FM) layers, a hard layer 404 and a free layer 406. The two FM layers 404 and 406 are separated with a tunneling barrier 408. The magnetization of FM layer 404, referred to as the fixed or hard layer, is pinned or fixed by virtue of being thicker or exchange coupled to an antiferromagnetic layer. The magnetization of FM layer 406, referred to as the free layer, is free and can be aligned either parallel (P) or antiparallel (AP) to the magnetization of the fixed layer 404. In practice, electrons are able to tunnel through the thin tunneling barrier 408 as long as a bias voltage is applied across MTJ 402. The P state exhibits low electrical resistance. The AP state exhibits high electrical resistance, which is commonly 2 to 8 orders of magnitude higher than the P state. The magnetic state of an MTJ can be used to represent a bit of information.

The magnetic state of MTJ 402 can be controlled magnetically through a remote current pulse or electrically through a direct current pulse. The ability to control the magnetic state of MTJ 402 allows MTJ 402 to operate in high performance applications that require low power consumption. The magnetic state of MTJ 402 can also be electrically controlled through the spin transfer torque (STT) effect. The STT effect occurs when the orientation of a magnetic layer for example, FM layers 404 or 406 of MTJ 402 is modified using a spin-polarized current. In other words, by passing a current through MTJ 402 having more electrons being either spin-up or spin-down.

The STT effect controls the magnetic state of MTJ 402 using current pulses that transport spin angular momentum to MTJ 402. For a specific duration of the current pulse, operation of the STT effect is maintained provided that the amplitude of the current pulse is larger than a current threshold. Since the current threshold of MTJ 402 grows significantly as the duration of the current pulses decreases, the performance of fast operations of MTJ 402 through the use of the STT effect can affect the power efficiency of MTJ 402.

Phase change memory (PCM) technology is a non-volatile random-access memory that typically includes an amorphous state and a crystalline state. A PCM in operation relies on a large resistance contrast between the amorphous and the crystalline states in its phase change materials. The amorphous phase tends to have high electrical resistivity. The crystalline phase exhibits a low resistivity, which in some instances is 3 or 4 orders of magnitude lower than the amorphous state. Due to this large resistance contrast, the change in read current is quite large, which allows a PCM to provide for the multiple analog levels needed for multilevel cell (MLC) operations.

To set a PCM cell into the low-resistance state, typically an electrical pulse can be applied which heats a significant portion of the PCM cell above the crystallization temperature of its phase change material. The required duration of the pulse depends on the crystallization speed of the phase change material. The duration of the pulse determines the write speed of the PCM, which can require pulses shorter than 10 ns in some instances.

Referring to FIG. 5, shown is graph 502, which depicts how voltage over time affects a PCM. Programming a PCM device involves application of electrical power on the PCM through an applied voltage, which leads to internal temperature changes in the PCM. This results in quick heating and quenching of the phase change material, making it amorphous, or holding it in its crystallization temperature range for some time, thereby switching it to a crystalline state. The dotted line $T_{melt}$ indicates the temperature at which the phase change material melts, and dotted line $T_{cryst}$ indicates the temperature at which the phase change material crystalizes. A low voltage is typically used to sense the device resistance, so that the device state is not perturbed as illustrated by curve 508.

To reset the cell into the high-resistance state, a larger electrical current is applied in order to melt the central portion of the cell as depicted by curve 504. If this pulse is stopped abruptly enough, the molten material quenches into the amorphous phase, producing a cell in the high-resistance state. The reset operation, as shown by curve 506, requires a relatively large amount of current and power. This requires an access device capable of delivering high current and power without itself requiring a significantly larger footprint than the PCM element itself. As is evident from FIG. 5, the duration that a voltage is applied for the reset pulse in curve 504 is significantly less than the duration of the set pulse in curve 506. The read operation is performed by measuring the device resistance at low voltage, so that the device state is not perturbed.

Computer models of physical systems are a vital part of modern scientific and engineering research. Large scale models of the Earth's weather, climate, and geologic activity, biological cell structures, the motion and interactions of structures in the universe, fluid dynamics, electronic circuits, and even economic systems all require an immense amount of computing resources to run. These simulations run on tens of thousands of processors, non-stop, several months at a time before reaching completion. Complex models can be described in the form of systems of continuous partial differential equations.

The most common way of solving such systems is to discretize them. In other words, transform the systems into discrete difference equations. These difference equations serve as an approximation for the original system. Discretization can be accomplished using finite difference, finite element, and finite volume methods. The resulting difference equations can be written as a sparse linear system in the general form Ax=b, wherein A can be an m×n matrix, with columns $a_1, a_2, \ldots, a_n$, and x can be in $R^n$, wherein $R^n$ is a vector of n real numbers, then the product of A and x denoted Ax is the linear combination of the columns of A using the corresponding entries in x. Here, sparse refers to the fact that the elements of the coefficient matrix A are predominantly zero.

Direct methods for solving linear systems include Gaussian elimination, which seek to arrive at the exact solution through a finite number of operations. Iterative methods for solving linear systems begin by guessing the solution and then proceed to improve upon that guess in a sequence of steps. Each successive step generates an approximation that is closer to the solution than the previous one. Unlike direct methods, iterative methods do not arrive at the exact solution, but they produce an answer that is close to the exact solution. Aspects of this disclosure provide a means to enable iterative methods of solving problems.

Stationary and Krylov subspace methods are the two main classes of iterative methods for solving linear systems. Stationary methods include the Jacobi, the Gauss-Seidel, and the successive over-relaxation (SOR) methods. These methods involve starting with an initial guess as to the solution of a linear system and then recursively improving the guess by reducing the error between the current estimate and the solution. Reducing the error includes removing one of its vector components for each iteration. The Jacobi method is based on solving for every variable locally with respect to the other variables. One iteration corresponds to solving for every variable once. The Jacobi method is typically slower to converge than the other stationary methods.

The Gauss-Seidel method is similar to the Jacobi method except that it uses updated values as soon as they are available. The SOR method can be derived from the Gauss-Seidel method by introducing an extrapolation parameter. The accuracy of the solution from each of the methods can be adjusted by modifying the convergence tolerance to the desired value. The Jacobi, Gauss-Seidel, and SOR methods differ from each other in the way they split up the coefficient matrix. All of them are characterized by the general recursive equation $x_{(k+1)}=Gx_{(k)}+f$, wherein $G=I-M^{-1}A$, $f=M^{-1}b$ and k is the iteration count. In the equation for the iteration matrix G, I is the identity matrix, A is the preconditioning matrix and A is the coefficient matrix of the linear system to be solved. In the equation for f, b is the right-hand side vector of the linear system to be solved. An identity matrix is an n×n matrix with ones on the main diagonal and zeros elsewhere. These methods rely on decomposing matrix A into its diagonal, strict upper triangular, and strict lower triangular matrices. Stationary methods converge only for a limited class of matrices. If the spectral radius of matrix G is less than 1, then the recursive equation will converge to the solution. The spectral radius associated with the iteration matrix determines the speed of convergence.

Methods based on Krylov subspaces include conjugate gradient (CG), generalized minimal residual method (GMRES), biconjugate gradient (BiCG) and the like. These methods involve creating a basis made up of the sequence of successive powers of the matrix multiplied by the initial residual. This is known as a Krylov sequence. Iterative approximations are then performed by minimizing the residual over the Krylov sequence basis. These methods usually converge in n iterations, where n is the size of the linear system, unless there are rounding errors. CG is usually expected to converge in many fewer iterations than n.

There is also a separate set of iterative algorithms that can also be used as preconditioners, which are collectively referred to as multigrid (MG). MG is effective because the number of iterations it takes to converge does not vary with the size of the linear system. For MG, the speed of convergence can be increased by moving back and forth between a fine and a coarse mesh grid granularity. Stationary methods can generally quickly remove the error vector components that point in the directions of the eigenvectors of the iteration matrix that are associated with the largest eigenvalues (high frequency modes). Annihilating the other components (low frequency modes) is a more challenging task for stationary methods. However, these low frequency modes easily map to high frequency modes on a coarser grid. Thus, MG starts with a few stationary iterations on a fine grid, which removes high frequency components, and then proceeds to coarsen the mesh so that the remaining error components can be rapidly removed. The MG procedure can be optimized by adjusting the number of coarseness levels and the number of times it cycles from fine to coarse and then back to fine granularity. Changing the mesh between different granularities is accomplished using special interpolation and restriction matrices.

In math, preconditioning generally refers to applying a preconditioner transformation that adjusts a particular problem such that it becomes easier to solve numerically. In the specific case of linear iterative solvers, preconditioning refers to a procedure where matrix A in the vector equation Ax=b is multiplied by the inverse of a preconditioner matrix P such that the resulting product has a lower condition number than A. The lower the condition number, the higher the rate of convergence. Preconditioning the coefficient matrix before applying iterative methods greatly reduces the time to convergence.

Conventional few-core microprocessors are poorly suited for solving large systems of linear equations. Conventional few-core microprocessors have a limited ability to perform many calculations simultaneously or in other words have little parallelism. Therefore, while each individual problem or floating-point operation may be able to be performed quickly by a conventional few-core microprocessor, the system requires substantial time to solve the entire system of linear equations.

However, single-instruction multiple-data (SIMD) processors are able to perform the same operation on multiple pieces of data at the same time. Graphics Processing Units (GPUs) can perform these operations in support of graphics rendering, and also for general-purpose scientific computing.

Another way to perform computations faster is to have substantially more processor cores. For example, supercomputers can split up a problem into smaller chunks that are processed in parallel across its different nodes.

Many equations are much more natural to perform in an analog environment. Equations that would require many discrete calculations to be performed in a digital environment could be processed more quickly by using analog elements instead. A downside to analog processing is that the results are imprecise due to natural variations in the circuit elements and noise. However, if the error in the analog processing is acceptable, or the result can then be fed into a digital solver, there can be time and energy savings.

One task for which scientific computing is used is real world simulations. For example, the uses include weather forecasting and detailed physics modeling. Another example is the determination of analog behavior of electric circuits. The base algorithms for many of these models involve solving large linear systems.

Aspects of the present disclosure provide a general-purpose analog accelerator for solving linear systems. Aspects of the analog accelerator are able to sit on and operably communicate, interact with, and function with an existing data bus in a general computing system.

Aspects of the present disclosure are able to operably integrate with existing digital iterative solvers running on existing general-purpose digital compute logic, which include for example CPUs, general-purpose graphics processing units (GP-GPUs), and the like. The result or results from a solver or analog accelerator is intended in aspects to be used as a "seed" or initial guess in iterative solvers which will likely reduce the number of needed iterations to find a solution. The analog accelerator may also be used to speed up processing of existing iterations.

Reference is now made to FIG. 6, which presents a cross-point array suitable for practicing aspects of this disclosure. Shown in FIG. 6 is an analog accelerator or an accelerator 602, which includes a programmable resistive crosspoint array 604 and a CPU/Digital Iterative Solver 606. A CPU 606 includes any electronic circuitry within a computer that carries out instructions of a computer program. CPU 606 may also include a processor 614 (not shown), a memory 616 (not shown) storing computer program instructions 618 (not shown). As depicted, array 604 includes four analog-to-digital converters (ADCs) 608, four digital-to-analog converters (DACs) 610, and numerous resistors 612. It should be appreciated that while accelerator 602 includes four ADCs 608, four DACs 610, and sixteen (16) resistors 612, aspects of accelerator 602 include more or less ADCs 608, DACs 610, and resistors 612 than depicted in FIG. 6 provided it is operable as described herein.

Aspects of array 604 also include one or more drivers for operating array 604, one or more sensors for sensing current and/or voltage within array 604, and/or one or more control logic for operating array 604. ADC 608 includes any device that operably converts a continuous physical quantity, such as voltage to a digital number that represents the quantity's amplitude. DAC 610 includes any device that operably converts digital data, such as binary into an analog signal. An analog signal includes current, voltage, or electric charge. A resistor 612 includes any type of passive two-terminal electrical component that implements electrical resistance as a circuit element and is operable as described herein. Aspects of the array 604 are configurable to operably interface with any type of computing system known in the art including CPUs, GP-GPUs, and the like. Aspects of this disclosure also include array 604 interfacing with a dedicated driver circuitry. An exemplary dedicated driver circuitry is a circuitry operable to perform iterations as described herein in an autonomous manner without interaction with a processor or a digital iterative solver (except for its initial setup). Aspects of the interface between array 604 and CPU 606 can be memory-mapped with direct memory access (DMA) based transfers to and from the accelerator 602. For example, there can be a direct byte-for-byte correlation for the elements of matrix A between array 604 and CPU 606. Aspects may also include a control interface (not shown) operably connected to CPU 606 and/or to start calculations, interrupt calculations, autonomous operations, such as performing iterative refinement by accelerator 602, and/or to determine the status of the array or the calculations it is performing.

Aspects of the accelerator 602 may have write speeds to the array, which are slower than a rate at which data can be streamed or sent to accelerator 602. For example, exemplary video cards compatible with this disclosure may support bandwidth of up to 512 GB/sec. Accordingly, accelerators 602 may buffer incoming data. This may be accomplished through the use of back-pressure along a data bus to the DMA controller. Aspects of the accelerator 602, depending on constraints such as speed, power, chip area, and timing may require the need for multiple outputs to share the same ADC.

Aspects of the present disclosure utilize an analog solver or accelerator 602 to solve mathematical equations, such as linear algebra equations using iterative methods to produce an answer that is approximately exact. Answers are approximately exact because they may include errors present in the analog components or the components in the accelerator 602 itself. However, the approximate solution or result from accelerator 602 can be used as a guess to the existing digital iterative methods, and thereby eliminate some of the iterations of the digital iterative methods thereby reducing total calculation time and energy.

An iterative solver or CPU 606 would first load an exemplary accelerator 602 with a matrix at line 601 being used such as the matrix A from the equation Ax=b. Loading accelerator 602 with matrix A can include setting resistances on resistors 612 of array 604 that correspond to the values of matrix A. In one aspect, the resistance values set on resistors 612 or other resistive elements of accelerator 602 represent a transformed value of matrix A described by the equation $R_{i,j}=B+S/A_{i,j}$, wherein R is the resistance of a resistor 612 at a location represented by i and j, A is the value of a particular element of the matrix, and B and S are bias and scaling factors respectively to bring the programmed values into a range that can be utilized by accelerator 602. Next, the CPU 606 would send the right-hand side of the equation to the accelerator 602. In this example, the CPU 606 would send the known b-vector to the accelerator at line 603. The accelerator 602 would return a value $x^i$ at line 605 that is close to the desired x, wherein x is an unknown and i is the number of iterations. The CPU 606 would then use $x^i$ as an initial guessed seed to solve the equation Ax=b. Typically, $x^i \approx x$, allowing the iterative method of the CPU to complete in fewer iterations than would have otherwise been required without the accelerator 602. Depending on the characteristics of matrix A and the technology used to implement the accelerator, the error in the result might even be small enough to avoid requiring the CPU to perform any conventional iterations.

In other aspects, accelerator 602 can be used for matrix-vector multiplication. In this aspect, iterative solver or CPU 606 would first load an accelerator 602 with a matrix at line 601 being used such as the matrix A from the equation Ax=b. Next, the CPU 606 would send the known x-vector to the accelerator at line 607. The accelerator 602 would return a value b at line 609. CPU 606 would then use b in the process of solving the system of linear equations faster. An accelerator could also be built such that an iterative algorithm, such as Conjugate Gradient or Iterative Refinement is carried out on the accelerator without needing CPU involvement except for initial programming and then returning the result to the CPU. Generally, Iterative Refinement is an iterative method to improve the accuracy of numerical solutions to systems of linear equations.

A crosspoint array 604 is initialized by providing the contents of a matrix such as matrix A from the equation Ax=b from the CPU 606. In some aspects, this will include the information from matrix A being memory-mapped to the accelerator. Upon the accelerator 602 receiving the data of the matrix, the programming circuitry such as voltage sources 610 and current sources 615 set the resistances of the crosspoint cells 611 of array 604 based on the values in the matrix. As shown in FIG. 6, each crosspoint cell 611 includes a single resistor 612. However, it should be appreciated that aspects of crosspoint cells 611 can include one or more resistors 612 and/or one or more transistors (not shown). The resistances of the crosspoint cells 611 of array 604 can be set with appropriate current sources 615 and digital-to-analog converters (DACs) 610 that act as voltage sources. Aspects of the present system provide for the crosspoint cells 611 of the accelerator 602 to be both individually programmed and/or collectively erased and/or collectively loaded with data. Collectively erasing or collectively loading the data from the matrix onto the crosspoint cells 611 of the accelerator 602 may reduce programming time of the accelerator 602.

Once array 604 is programmed with the matrix A, an exemplary accelerator 602 can be configured for either sparse matrix-vector-multiplication (SpMVM) by solving for the variable b in Ax=b or as an initial seed generator by solving for x in Ax=b. However, first the voltage sources 610 or current sources 615 need to be programmed with the data for x or b depending on which configuration is being used. Similar with matrix A, the data for x or b may also be sent by a memory-mapped interface from the CPU 606 to the array 604.

As soon as the programming is completed, the accelerator's 602 result will be available to the ammeters 613 or ADCs 608. The DACs 610 will have some timing constraints after which their data will be available by a memory-mapped interface. For instance, in one aspect, there will be an implementation-dependent time period after which the output of the accelerator's 602 results will be stable or at a desired value that is no longer changing. As the results stabilize ammeters 613 and ADCs 608 will be able to sense the voltages and currents in array 604. CPU 606 will then capture the stabilized voltage and current values. A control/status channel may be used by the driver to either poll for readiness, or to receive an interrupt when the output data is ready to be read.

The accelerator 602 may be implemented as an add-in card operably coupled to an existing industry-standard memory-mapped bus, for example PCI-Express. Accelerator 602 operably communicates with a carrier circuit board as it would include termination and interface components, along with power regulation for the accelerator 602 application specific integrated circuit system-on chip (ASIC SoC). In some aspects, an ASIC and power regulator can be included directly on an existing system board, which could avoid the use of a socketed card.

Aspects of accelerator 602 may be designed as a memory-mapped device that uses special function registers to specify the solving mode (SpMVM or solver) and determine status (ready to read out).

An ASIC can be designed based on a square crosspoint array of programmable resistive elements as shown in FIG. 6 by array 604. In another aspect, an ASIC design can be based on a non-square array wherein multiple cells with differing resistance ranges are used together to generate a total derived resistance. In addition to the circuitry to be able to independently program each crosspoint cell 611 to a specified value, accelerator 602 also includes voltage sources 610 and current sources 615 and meters ADC 608 and ammeters 613 on the periphery of the array 604. Aspects of accelerator 602 include both one meter (for example ammeter 613) for each row/column of array 604, and one meter (for example ammeter 613) for multiple rows/columns, which may require in some embodiments a multiplexing scheme. Aspects of the present system also include additional bus interface circuitry between CPU 606 and accelerator 602 necessary to implement memory mapping, and control and status registers.

To obtain the currents and voltages in a large resistive network, the network can be converted, using Kirchhoff's laws, into a system of linear equations. Given known resistor values and voltage or current inputs, solving the system provides the remaining unknowns. The reverse is also true: given a system of linear equations, it is possible to implement a resistor network that provides the solution to that linear system.

FIG. 7 presents a linear system solver based on a resistive cross-point array suitable for solving linear systems. FIG. 7 shows solving a linear system such as Ax=b through applying currents to a memristor crosspoint array and measuring voltages. Depicted in FIG. 7 is array 702, which includes multiple crosspoint cells 704 that include resistors 706.

According to Kirchhoff's current laws, $$\sum_{j=1}^{n} \frac{V_0 - V_j}{R_{ij}} = I_i, i = 1 \ldots n,$$

which can be mapped to solve the linear system Ax=b because $\sum_{j=1}^{n} a_{ij}x_j = b_k$. The input currents $I_1, I_2, \ldots, I_n$ on the vertical wires 708 represent the vector b from the equation Ax=b. The conductances or resistors 706 at the crosspoint nodes $1/R_{11}, 1/R_{12}, \ldots, 1/R_{nn}$ corresponds to the values in a n×n matrix A; and voltages $V_0, V_1, V_2, \ldots, V_n$ are measured to resolve the vector x, since $V_0 - V_i$ represents $x_i$.

Aspects of array 702 and accelerator 602 can include a delta sigma (ΔΣ) ADC. A ΔΣ ADC provides a mechanism to sense and digitize an analog signal at nodes of array 702 and accelerator 602. Aspects of ΔΣ ADC include a ΔΣ modulator followed by a digital/decimator filter. A ΔΣ modulator is operable to quantize an analog input signal and reduce noise at lower frequencies. Aspects of ΔΣ ADC operably implement a function called noise shaping that pushes low-frequency noise up to higher frequencies where it is outside the band of interest.

In certain aspects, noise in a modulator can be moved to higher frequencies. Increasing the order of the modulator reduces the modulator's in-band quantization noise. Sharing a sensor over multiple rows of array 702 or accelerator 602 overcomes the problem of area and power overhead with having one sensor per row because less power is required to power a fewer number of sensors. However, a reduced output data rate ($f_D$) can be increased by increasing the decimation ratio (DR). Although increasing the DR pushes the $f_D$ toward the higher frequencies, the effective number of bits (ENOB) is reduced since the noise is stronger at higher frequencies (due to noise shaping). The DR can be increased by increasing the master clock rate, which keeps the ENOB high, but this too increases the power consumption for the array 702 or accelerator 602. Thus, certain aspects include a tradeoff between the order of the modulator, the number of the active sensors over the array (for example array 702 or accelerator 602) at each sense operation, and the output data rate.

Aspects of the present system provide that the values of FIG. 7 can be mapped linear equations, for example to the equation Ax=b. For instance, the resistances ($R_{11}, R_{21}, R_{12}, R_{22}$, etc.) of resistors 706, the voltage values ($V_1, V_2, \ldots V_n$) of the rows 710, and the current values ($I_1, I_2, \ldots I_n$) of columns 708 can be mapped to the equation Ax=b as follows:

$$\begin{bmatrix} 1/R_{11} & 1/R_{21} \\ 1/R_{12} & 1/R_{22} \end{bmatrix} \begin{bmatrix} V_1 \\ V_2 \end{bmatrix} = \begin{bmatrix} I_1 \\ I_2 \end{bmatrix}$$

However, it is understood that aspects of the present system provide for the representation of numerous different configurations of linear equations, which can be mapped to a resistive array, such as array 702 or accelerator 602 by the values of resistance, voltage, and current.

Resistive arrays such as array 702 or accelerator 602 may find it difficult to represent negative coefficients of matrix A in their resistive networks because it requires the use of negative resistance. One solution is to expand a given linear system to include auxiliary variables and equations. The auxiliary variables and equations are able to transform A into a matrix composed of only positive coefficients. For instance, if one of the equations in a given linear system is $2x_1 - x_2 - 7x_3 = 0$, wherein x is an unknown variable, the negative x variables can be expressed in terms of positive z variables, where $z1 = -x1$ $z2 = -x2$ $z3 = -x3$ This transformation adds three (3) new variables to the linear system and the sample equation becomes $2x_1 + 0x_2 + 0x_3 + 0z_1 + 1z_2 + 7z_3 = 0$. Since the system now includes three (3) additional variables, solving it requires three (3) additional equations. The definitions for the z variables provide these additional equations. These definitions can be written as (1) $z_1 + x_1 = 0$, (2) $z_2 + x_2 = 0$, and (3) $z_3 + x_3 = 0$.

The three (3) additional variables and the three (3) additional equations expand the original coefficient matrix from a size of 3×3 to a size of 6×6, or more generally, from n×n to 2n×2n. The expanded matrix can now be represented in the resistive network because it no longer contains any negative values.

A system of linear equations in complex-space may arise in many applications. However, the resistance of a resistor has values from the real space and not complex-space. Therefore, to solve a system of linear equations in complex space with an exemplary accelerator the inconsistency needs to be reconciled. Aspects of the present system provide for every system of linear equations in complex-space an equivalent system of linear equations in real-space. For example, Ax=b may be a system of linear equations in complex space, where $A = [A_1, \ldots, A_i, \ldots A_N]^T$ is the coefficients matrix, and $x = [x_1, \ldots, x_i, \ldots, x^N]^T$ is the unknown vector. From this equation $A_i x = b_i$ Expanding the equation leads to $$[a_{i,1}^r+ja_{i,1}^i, \ldots, a_{i,j}^r+ja_{i,j}^i, a_{i,N}^r+ja_{i,N}^i] \times [x_1^r+jx_1^i, \ldots, x_2^r+jx_j^i, \ldots x_N^r+jx_N^i]^T = b_i^r+jb_i^i,$$

Where superscript r and i stand for real and imaginary parts, respectively. From this expansion, it can be concluded that $$\sum_{j=1}^N a_{i,j}^r x_j^r - a_{i,j}^i x_j^i = b_i^r,$$

$$\sum_{j=1}^N a_{i,j}^r x_j^i + a_{i,j}^i x_j^r = b_i^i.$$

Rewriting these equations in the matrix form, provided is $$[a_{i1}^r \ldots a_{iN}^r - a_{i1}^i \ldots -a_{iN}^i] \times [x_1^r \ldots x_N^r x_1^i \ldots x_N^i]^T = b_i^r$$

$$[-a_{i1}^i \ldots -a_{iN}^i a_{i1}^r \ldots a_{iN}^r] \times [x_1^r \ldots x_N^r x_1^i \ldots x_N^i]^T = b_i^i.$$

Combining these two equations, the following equivalent system of linear equations in the real-space is determined, $$\begin{bmatrix} A^r & -A^i \\ A^i & A^r \end{bmatrix} \times \begin{bmatrix} x^r \\ x^i \end{bmatrix} = \begin{bmatrix} b^r \\ b^i \end{bmatrix}.$$

The general system diagram of FIG. 6 includes separate lines for resolved and known values of the x and b vectors. This is because in addition to using the array 604 as an initial guess generator, aspects of array 604 can also serve as a matrix-vector multiplier. If the b-vector currents are treated as outputs instead of inputs and the x-vector voltages are treated as inputs instead of outputs, the array 604 will generate the product vector of matrix A and vector x in the form of currents. Using the resistive network as a matrix-vector multiplier can thus potentially speed up the computation of points $x_i$ defined by the iterative equations of various methods. These iterative equations depend on constantly recalculating matrix-vector products, which the resistive array 604 can accomplish almost instantly. These products could be supplied to the digital solver or CPU 606, accelerating the final computation of the solution x. In another aspect, the use of the digital solver or CPU 606 is avoided altogether. Array 604 is used to generate an initial guess in the first phase of the computation. For the second phase of the computation, array 604 is used as a matrix-vector multiplier and iterative methods run on it until a desired accuracy of the solution is achieved. Iterative methods such as iterative refinement could even be used, switching the usage of the array between a solver and a matrix-vector multiplier.

Aspects of the disclosed resistive network are able to accommodate coefficient matrices of various sizes. However, most matrices from real applications are so large that they cannot fit into a single resistive array. These matrices have to be spread across multiple small arrays. For example, common problem sets involve square matrices that range from a dimension of n=5 to n=118142155. The latter matrix dimension would require a single cross-point array containing almost 14 quadrillion memristors, which is not feasible. Increasing the array size typically increases the amount of sneak current in the wordlines and bitlines. Sneak current makes it difficult to sense the contents of a memristor during a read. Also, the wordlines and bitlines are not ideal, which means they may have some intrinsic resistance which can affect the memristor readings. Generally, for exemplary arrays 704, the longer the line, the higher the resistance. This resistance can cause unwanted voltage drops in an array, which forces the driving voltage for a write to go up in order to compensate. However, the driving voltage has a strict upper limit because at some threshold it will become so high that it will modify some cell contents unintentionally. A high driving voltage and current also implies larger peripheral circuitry. Increasing the nonlinearity coefficient of a memristor alleviates some of these constraints, but only to a certain extent. Utilizing the available non-linearity, the size of a memristor array should not exceed 1024 by 1024. Otherwise, reliability cannot be guaranteed. However, aspects of this disclosure include memristor arrays that are much smaller than 1024 by 1024 and memristor arrays that are much larger than 1024 by 1024.

Referring now to FIG. 8, presented is a logic flow diagram in accordance with a method and apparatus for performing aspects of the present system. Block 802 presents (a) receiving, by a resistive memory array, a first data, the resistive memory array comprising a plurality of crosspoint cells, wherein the receiving comprises setting a plurality of resistances on the plurality of crosspoint cells, wherein each of the plurality of resistances are based on the first data; (b) receiving, by the resistive memory array, a second data, wherein the receiving comprises applying at least one of a current and a voltage on the plurality of crosspoint cells; and (c) determining, by the resistive memory array, an initial unknown value, the initial value based on the first data and the second data. Then block 804 specifies wherein the first data comprises a coefficient matrix of a system of linear equations.

Some of the no-limiting implementations detailed above are also summarized at FIG. 8 following block 804. Block 806 specifies wherein the second data is based on a known b-vector or a known x-vector of the linear equation. Then block 808 relates to wherein the initial unknown value comprises an approximate solution to the linear equation. Block 810 specifies further comprising setting a plurality of resistances on the plurality of cells, wherein each of the plurality of resistances are based on the determined initial unknown value, applying at least one of a current and a voltage on the plurality of cells based on the second data, and determining second initial unknown value based on the determined initial unknown value and the second data. Then at block 812 it states wherein the determined second initial unknown value is a closer approximate solution to the system of linear equations than the initial unknown value.

The logic diagram of FIG. 8 may be considered to illustrate the operation of a method, a result of execution of computer program instructions stored in a computer-readable medium. The logic diagram of FIG. 8 may also be considered a specific manner in which components of a device are configured to cause that device to operate, whether such a device is a computer, laptop, supercomputer, resistive memory array, or one or more components thereof. The various blocks shown in FIG. 8 may also be considered as a plurality of coupled logic circuit elements constructed to carry out the associated function(s), or specific result of strings of computer program instructions or code stored in memory, or resistance stored in a resistive memory array.

Various aspects of the computer-readable medium include any data storage technology type which is suitable to the local technical environment, including but not limited to semiconductor based memory devices, magnetic memory devices and systems, optical memory devices and systems, fixed memory, removable memory, disc memory, flash memory, dynamic random-access memory (DRAM), static random-access memory (SRAM), electronically erasable programmable read-only memory (EEPROM), resistive memory, and the like. Various aspects of the processor include but are not limited to general purpose computers, special purpose computers, microprocessors, digital signal processors, and multi-core processors.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art, which are also intended to be encompassed by the following claims.

The invention claimed is:

1. An apparatus for solving, the apparatus comprising:
   (a) at least one resistive memory array, the resistive memory array comprising a plurality of crosspoint cells, a plurality of digital-to-analog converters, a plurality of analog-to-digital converters, a plurality of voltage sources, and a plurality of current sources, each one of the plurality of crosspoint cells comprising at least one resistor, the at least one resistive memory array programmable by the plurality of current sources and the plurality of voltage sources, and wherein the programmable at least one resistive memory array comprises setting a plurality of resistances on the plurality of resistors based on applying a programmable current from the plurality of current sources and a programmable voltage from the plurality of voltage sources; and
   (b) at least one sensor, the at least one sensor being operatively coupled to the at least one resistive memory array able to sense at least one of a voltage and a current on the plurality of crosspoint cells.

2. The apparatus according to claim 1, wherein the at least one resistive memory array is able to determine an unknown value based on the current and the voltage on the plurality of resistors.

3. The apparatus according to claim 2, wherein the current is based on a coefficient matrix of a system of linear equations.

4. The apparatus according to claim 3, wherein the voltage is based on a known b-vector or a known x-vector of the system of linear equations.

5. The apparatus according to claim 4, wherein the initial unknown value comprises a possible solution to the system of linear equations.

6. An apparatus for solving, the apparatus comprising:
   at least one resistive memory array, the resistive memory array comprising a plurality of crosspoint cells, a plurality of digital-to-analog converters, a plurality of analog-to-digital converters, a plurality of voltage sources, and a plurality of current sources, wherein each one of the plurality of crosspoint cells comprise at least one resistor, the at least one resistive memory array programmable by the plurality of current sources, and wherein the programmable at least one resistive memory array comprises setting a plurality of resistances on the plurality of resistors based applying a programmable current from the plurality of current sources and a programmable voltage from the plurality of voltage sources, wherein the at least one resistive memory array is configured to cause the apparatus to at least:
   apply a current on the at least one resistive memory array, wherein the setting comprises setting a plurality of resistances on the plurality of resistors, wherein each of the plurality of resistances are based on the current;
   apply at least one of a second current and a voltage on the at least one resistive memory array, wherein the setting comprises setting a second plurality of resistances on the plurality of resistors; and determine an initial unknown value, the initial value based on the applied current and voltage on the plurality of resistors.

7. The apparatus according to claim 6, wherein the current is based on a coefficient matrix of a system of linear equations.

8. The apparatus according to claim 7, wherein the at least one of second current and voltage is based on a known b-vector or a known x-vector of the system of linear equations.

9. The apparatus according to claim 6, wherein the initial unknown value comprises an approximate solution to the system of linear equations.

10. A resistive memory array for solving a system of linear equations, the resistive memory array comprising:
    a plurality of digital-to-analog converters, a plurality of analog-to-digital converters, a plurality of voltage sources, a plurality of current sources coupled to a plurality of crosspoint cells;
    wherein the plurality of crosspoint cells each comprising at least one resistor, each one of the plurality of resistors are programmable with at least a first coefficient matrix of the system of linear equations and a known b-vector of the system of linear equations, wherein the programmable plurality of resistors comprises setting a plurality of resistances on the plurality of resistors based on the first coefficient matrix and applying at least one of a programmable current and a programmable voltage based on the known b-vector; and
    at least one sensor, the at least one sensor being operatively coupled to the plurality of crosspoint cells able to sense at least one of a voltage and a current on the plurality of crosspoint cells.

11. The resistive memory array according to claim 10, wherein the resistive memory array is able to determine an unknown value based on the first coefficient matrix and the known b-vector.

* * * * *